United States Patent
Kobayashi (10) Patent No.: US 12,106,873 B2
(45) Date of Patent: Oct. 1, 2024

(54) TWO CORE FLAT CABLE

(71) Applicant: SUMITOMO ELECTRIC INDUSTRIES, LTD., Osaka (JP)

(72) Inventor: Yuto Kobayashi, Tochigi (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 243 days.

(21) Appl. No.: 17/626,193

(22) PCT Filed: Oct. 2, 2019

(86) PCT No.: PCT/JP2019/038988
§ 371 (c)(1),
(2) Date: Jan. 11, 2022

(87) PCT Pub. No.: WO2021/064915
PCT Pub. Date: Apr. 8, 2021

(65) Prior Publication Data
US 2022/0277870 A1    Sep. 1, 2022

(51) Int. Cl.
*H05K 9/00* (2006.01)
*H01B 7/08* (2006.01)
*H01B 13/22* (2006.01)

(52) U.S. Cl.
CPC ......... *H01B 7/0807* (2013.01); *H01B 7/0823* (2013.01); *H01B 13/22* (2013.01); *H05K 9/0098* (2013.01)

(58) Field of Classification Search
CPC .................................................. H05K 9/0098
See application file for complete search history.

(56) References Cited

U.S. PATENT DOCUMENTS

| | | | |
|---|---|---|---|
| 2012/0186850 A1 | 7/2012 | Sugiyama et al. | |
| 2012/0267159 A1 | 10/2012 | Gundel | |
| 2017/0133125 A1 | 5/2017 | Janssen et al. | |
| 2018/0075948 A1 | 3/2018 | Kobayashi | |
| 2018/0108455 A1 | 4/2018 | Kobayashi | |
| 2020/0203040 A1* | 6/2020 | Wu | H01R 13/6592 |
| 2021/0166836 A1* | 6/2021 | Nagano | H01B 11/1091 |
| 2022/0217878 A1* | 7/2022 | Xie | H05K 9/0088 |
| 2022/0312657 A1* | 9/2022 | Liu | H05K 9/0098 |
| 2023/0056385 A1* | 2/2023 | Goto | H01B 3/441 |

FOREIGN PATENT DOCUMENTS

| | | |
|---|---|---|
| JP | 2004-303697 | 10/2004 |
| JP | 2010-244838 | 10/2010 |
| JP | 2012-169251 | 9/2012 |
| JP | 2013-521611 | 6/2013 |
| JP | 2016-213112 | 12/2016 |
| JP | 2017-524226 | 8/2017 |
| JP | 2018-049812 | 3/2018 |
| JP | 2018-067435 | 4/2018 |

* cited by examiner

*Primary Examiner* — Hung V Ngo
(74) *Attorney, Agent, or Firm* — IPUSA, PLLC (57) ABSTRACT

A two-core flat cable includes a pair of metal wires, an insulating covering that bundles and covers the pair of metal wires along a longitudinal direction thereof, an electrically conductive shield that covers an entire perimeter surface of the covering, and an insulating sheath that covers the shield, wherein the shield is comprised of a metal coating layer, and the sheath is comprised of a lamination sheet of an insulating resin.

8 Claims, 7 Drawing Sheets

TWO CORE FLAT CABLE

TECHNICAL FIELD

The disclosures herein relate two-core flat cables.

BACKGROUND ART

Two-core flat cables are utilized as cables for transmitting differential signals, for example.

A two-core flat cable generally has at least a pair of metal wires bundled and covered with an insulating-resin covering. The outer surface of the covering has a metal shield and an insulating sheath arranged in this order.

In a related-art two-core flat cable, the metal shield and/or the sheath are formed by winding a tape-shaped member around the covering (see Patent Documents 1 and 2).

RELATED-ART DOCUMENTS

Patent Document

[Patent Document 1] Japanese Laid-open Patent Publication No. 2012-169251
[Patent Document 2] Japanese Laid-open Patent Publication No. 2018-67435

SUMMARY OF THE INVENTION

Problem to be Solved by the Invention

Related-art two-core flat cables may suffer a situation in which a sharp signal attenuation called a "dip" occurs in the radio-frequency range. Use of the two-core flat cables having the occurrence of such a dip may thus be restricted in the radio-frequency range.

The present invention is made in consideration of the noted background, and it is an object of the present invention to provide a two-core flat cable capable of reducing the occurrence of a dip.

Means to Solve the Problem

The present invention provides a two-core flat cable which includes:
a pair of metal wires;
an insulating covering that bundles and covers the pair of metal wires along a longitudinal direction thereof;
an electrically conductive shield that covers an entire perimeter surface of the covering; and
an insulating sheath that covers the shield,
wherein the shield is comprised of a metal coating layer, and
wherein the sheath is comprised of a laminate sheet of an insulating resin.

Advantage of the Invention

The present invention can provide a two-core flat cable capable of reducing the occurrence of a dip.

MODE FOR CARRYING OUT THE INVENTION

In the following, an embodiment of the invention will be described with reference to the accompanying drawings.

An embodiment of the present invention provides a two-core flat cable which includes:
a pair of metal wires;
an insulating covering that bundles and covers the pair of metal wires along a longitudinal direction thereof;
an electrically conductive shield that covers an entire perimeter surface of the covering; and
an insulating sheath that covers the shield,
wherein the shield is comprised of a metal coating layer, and
wherein the sheath is comprised of a lamination sheet of an insulating resin.

As was previously described, related-art two-core flat cables may suffer a situation in which a sharp signal attenuation called a "dip" occurs in the radio-frequency range.

Figure 1:
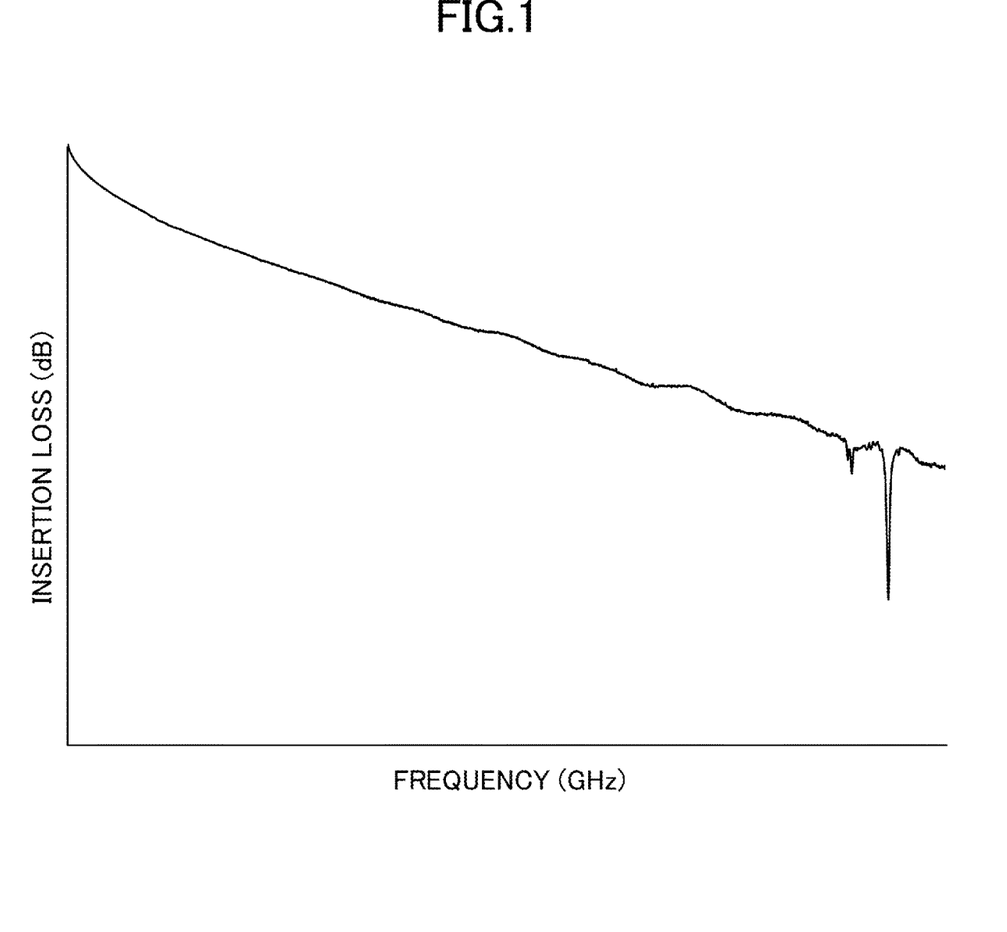
FIG. 1 is a graph schematically illustrating the relationship between signal frequency and insertion loss observed in a related-art two-core flat cable.

FIG. 1 schematically illustrates a typical relationship between signal frequency and insertion loss observed in a related-art two-core flat cable. It can be seen from this figure that a related-art two-core flat cable has a sharp signal attenuation, i.e., dip, occurring in the radio-frequency range.

There is a problem that use of a two-core flat cable in a frequency range associated with such a dip is problematic.

It may be noted that such a dip may occur due to the periodicity of some member constituting a two-core flat cable.

In a cable for transmitting differential signals disclosed in previously noted Patent Document 1, for example, the shield is formed by helically winding a metal foil tape around a core member, and the sheath is formed by helically winding a hold wrap tape around the shield. In this case, the periodicity of the shield and the periodicity of the sheathe are considered to cause a dip.

In a cable for transmitting differential signals disclosed in previously noted Patent Document 2, for example, the sheath is formed by helically winding an insulating resin tape around the exterior of a shield. In this case, the periodicity of the sheathe is considered to cause a dip.

In contrast, the two-core flat cable according to the embodiment of the present invention has a shield formed as a metal coating layer and a sheath formed as a lamination sheet of an insulating resin. Namely, the two-core flat cable according to the embodiment of the present invention is such that neither the shield nor the sheath has a structure made by winding a tape-shaped member, and the shield and/or the sheath do not have a periodic structure.

Accordingly, the two-core flat cable according to the embodiment of the present invention significantly reduces the occurrence of a dip that is conventionally observed otherwise. The embodiment of the present invention can thus provide a two-core flat cable in which a dip is unlikely to occur even in the radio-frequency range.

<Two-Core Flat Cable of Embodiment of Present Invention>

In the following, the two-core flat cable according to the embodiment of the present invention will be described in further detail with reference to FIG. 2 and FIG. 3.

Figure 2:
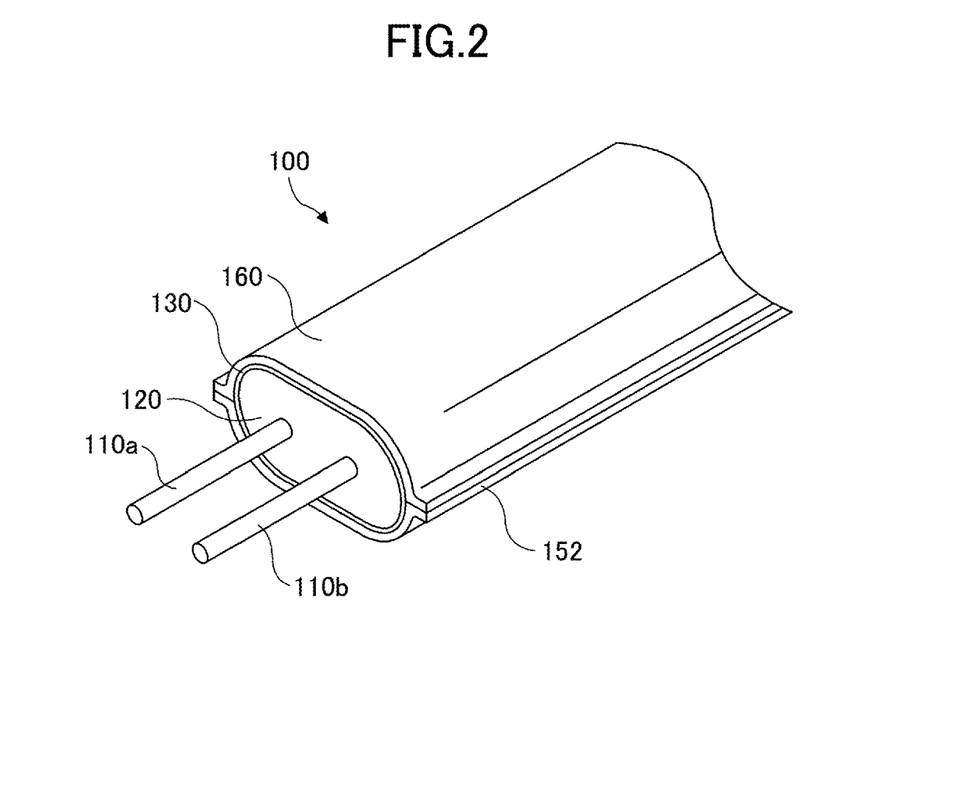
FIG. 2 is an axonometric view schematically illustrating the configuration of a two-core flat cable according to an embodiment of the present invention.

FIG. 2 illustrates a schematic axonometric view of a two-core flat cable 100 (hereinafter referred to as "first two-core flat cable") according to the embodiment of the present invention. Further, FIG. 3 schematically illustrates a cross-section perpendicular to the longitudinal direction of the first two-core flat cable 100 shown in FIG. 1.

Figure 3:
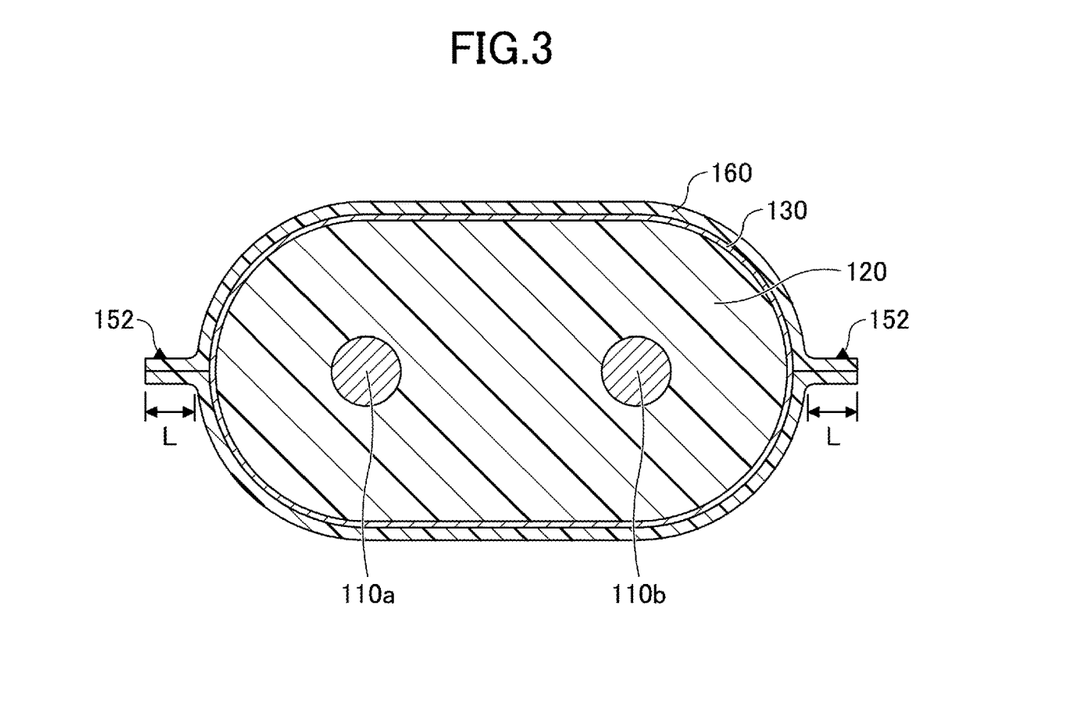
FIG. 3 is a drawing schematically illustrating a cross-section, perpendicular to the longitudinal direction, of the first two-core flat cable shown in FIG. 2.

As illustrated in FIG. 2 and FIG. 3, the first two-core flat cable 100 includes a metal wire 110a, a metal wire 110b, a covering 120, a shield 130, and a sheath 160.

The metal wires 110a and 110b contain a metallic material such as copper or aluminum, for example, and extend along the longitudinal direction (hereinafter also referred to as the "axial direction") of the first two-core flat cable 100 without contact with each other.

The covering 120 is configured to bundle and cover a least a portion of the length of the two metal wires 110a and 110b in the axial direction of the first two-core flat cable 100. The covering 120 is made of an insulating material such as an insulating resin.

The shield 130 is configured to cover the entire perimeter surface of the covering 120 along at least a portion of the length of the first two-core flat cable 100 in the axial direction thereof. The shield 130 is generally made of an electrically conductive material such as metal.

The sheath 160 is configured to cover the entire perimeter surface of the shield 130 along at least a portion of the length of the first two-core flat cable 100 in the axial direction thereof. The sheath 160 is generally made of an insulating material such as an insulating resin.

There are two flanges 152 on the outer surface of the sheath 160. The flanges 152 are formed as portions of resin sheets at the positions where they are bonded to each other in a laminating process for forming the sheath 160, as will be described later.

Here, the shield 130 of the first two-core flat cable 100 is comprised of a metal coating layer. For example, the shield 130 may be formed by vapor depositing or plating a metal around the covering 120.

The sheath 160 is formed by laminating insulating sheets around the shield 130. The insulating sheets may be made of, for example, an insulating resin or the like.

The first two-core flat cable 100 does not include a member that is formed by winding a tape-shaped member as is conventionally done.

The first two-core flat cable 100 can thus significantly reduce the occurrence of a dip on the radio-frequency range.

<Details of Components>

In the following, the details of components included in the first two-core flat cable 100 will be described. For the purpose of clarity, the reference characters illustrated in FIG. 2 and FIG. 3 will be used when referring to individual components.

<Metal Wire 110a>

The metal wire 110a may be made of a single metal wire. An electrically conductive coating layer may also be provided around the metal wire.

Metal that forms the metal wire 110a is not limited to a particular metal, but may be selected from, for example, copper (or copper alloy) and aluminum (or aluminum alloy). The coating layer may be a plated layer of tin or silver.

Alternatively, the metal wire 110a may be a twisted line.

The metal wire 110a is within a range from AWG38 to AWG22, for example, in the AWG (American Wire Gauge) standard.

The same also applies to the metal wire 110b.

The center-to-center distance between the metal wire 110a and the metal wire 110b is in a range of 0.5 to 5 times the diameter of either one of these, for example.

It may be noted that the number of metal wires covered with the covering 120 in the first two-core flat cable 100 is not limited to a particular number, and the number of metal wires may alternatively be three or more.

<Covering 120>

The covering 120 is made of an insulating material such as an insulating resin, for example.

As the insulating resin, for example, a thermoplastic resin having a low dielectric constant such as polyethylene (PE), polypropylene (PP), and polyvinyl chloride (PVC) is selected.

The cross-sectional shape of the covering 120 may be circular, oval, or the like. Oval shapes include an elliptical shape, a flattened circular shape, and a shape formed by connecting two parallel lines with arc-shaped curved lines. In particular, the cross-sectional shape of the covering 120 preferably has a long axis length of 1.2 to 2.5 relative to a short axis length of 1.

The covering 120 may be a solid, or may be foam. Foam is preferred due to its lower dielectric constant than that of a solid.

The covering 120 may be formed, for example, by an extrusion molding process.

<Shield 130>

The shield 130 is a coating layer. Examples of the coating layer may include, for example, copper, aluminum, silver, nickel, and the like.

The shield 130 may be formed by plating a metal on the outer surface of the covering 120 or by physically or chemically depositing the metal, although not limited to these.

Electroless plating is used as the plating method. In the electroless plating, a palladium catalyst may be used depending on the plated material.

A method of physically depositing a metal includes a vacuum deposition method. A method of chemically depositing a metal includes a chemical vapor deposition method such as a thermal CVD (chemical vapor deposition) and a plasma CVD.

The thickness of the shield 130 may preferably be greater than or equal to 0.1 µm and 10 µm. Generally, in the case in which the shield 130 is thin (e.g., less than or equal to 1 µm), the shield 130 may be formed by vapor deposition. In the case in which the shield 130 is thick, the shield 130 may be formed by plating.

The thickness of the shield 130 is in a range of 0.4 µm to 20 µm, for example.

<Sheath 160>

As was previously described, the sheath 160 is formed by laminating insulating sheets around the shield 130.

The sheath 160 is made of a resin such as polyethylene terephthalate (PET), polyvinyl chloride, or polyethylene. The sheath 160 made of such a material can prevent (provide protection against) external damage to the shield 130, thereby enabling the stabilization of electrical characteristics.

The thickness of the sheath 160 is in a range of 4 µm to 100 µm, for example.

The length of the flange 152 of the sheath 160 is 0.1 mm to 10 mm. The length of the flange 152 is preferably 0.1 mm to 1 mm, and even more preferably 0.1 mm to 0.5 mm. Use of the flange 152 with the length in this range enables the stabilization of electrical characteristics.

It may be noted that the respective lengths of the two flanges 152 need not be the same, and may be different from each other.

<Method of Making Two-Core Flat Cable of Embodiment of Present Invention>

In the following, an example of a method of making a two-core flat cable according to the embodiment of the present invention will be described with reference to FIG. 4 through FIG. 8.

Figure 4:
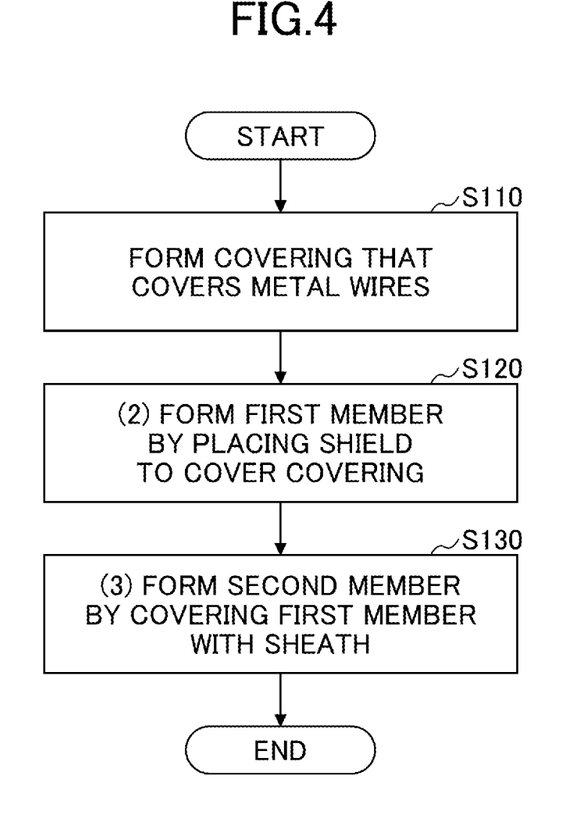
FIG. 4 is a flowchart schematically illustrating a method of making the two-core flat cable according to the embodiment of the present invention.

FIG. 4 schematically illustrates the flow of a method of making a two-core flat cable according to an embodiment of the present invention (hereinafter referred to as a "first method").

As illustrated in FIG. 4, the first method includes:
(1) a process step (S110) of forming a covering for covering metal wires;
(2) a process step (S120) of covering the covering with a shield to form a first member; and
(3) a process step (S130) of covering the first member with a sheath to form a second member.

In the following, each of the process steps will be described with reference to FIG. 5 through FIG. 8. In so doing, the first two-core flat cable 100 will be used, for the sake of clarity, as an example to describe each step. Accordingly, the reference characters illustrated in FIG. 2 and FIG. 3 will be used when referring to individual components.

<Process Step S110>

Figure 5:
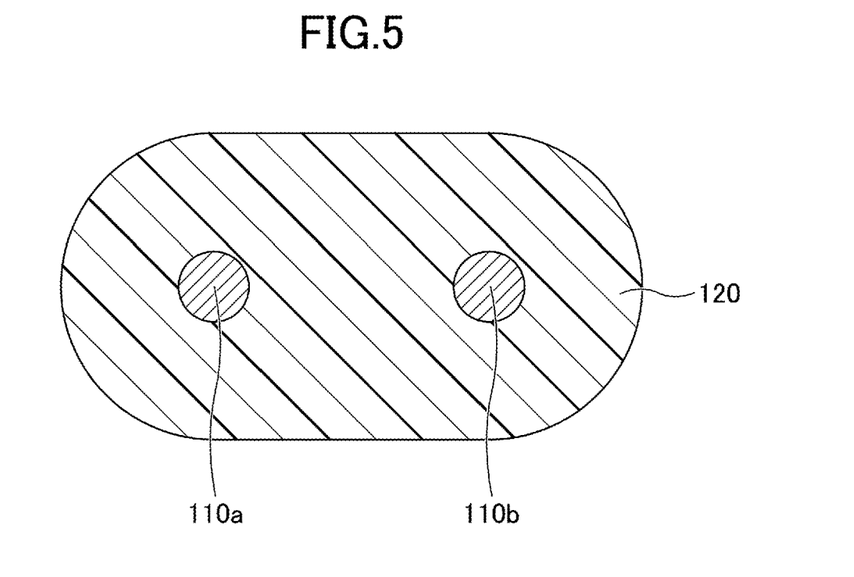
FIG. 5 is a drawing schematically illustrating a process step of making the two-core flat cable according to the embodiment of the present invention.

First, a metal wire 110a and a metal wire 110b are prepared. The metal wire 110a and the metal wire 110b are arranged in parallel to each other, with a constant distance therebetween.

Next, a resin serving as the covering 120 to encapsulate the metal wire 110a and the metal wire 110b is formed by extrusion.

With this arrangement, the covering 120 having a cross-section as illustrated in FIG. 5 is made. The covering 120 bundles and covers the metal wire 110a and the metal wire 110b.

<Process Step S120>

Figure 6:
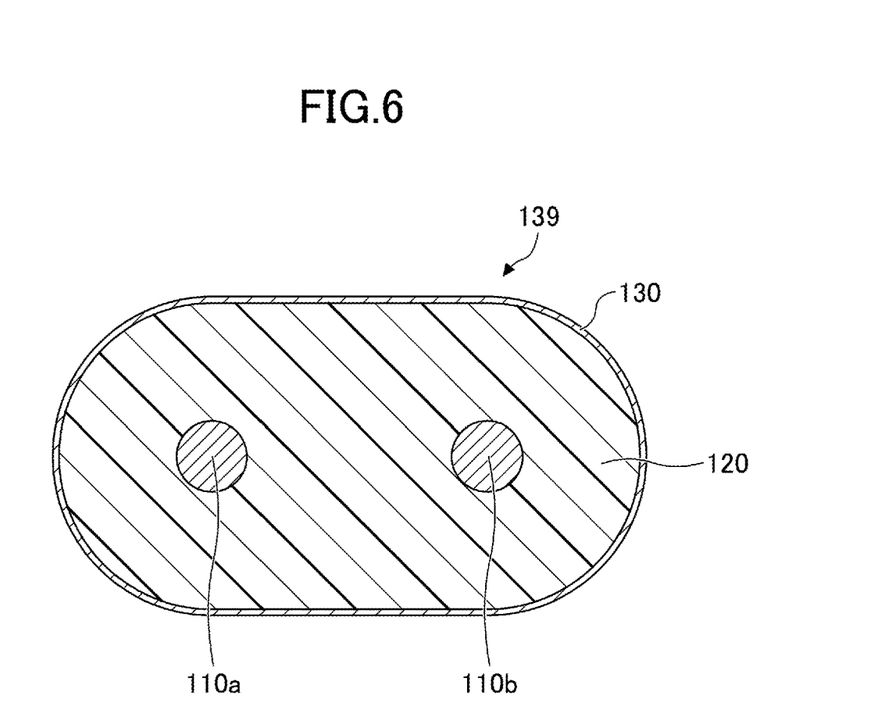
FIG. 6 is a drawing schematically illustrating a process step of making the two-core flat cable according to the embodiment of the present invention.

A shield 130 is then formed around the covering 120. As was previously noted, the shield 130 is formed by coating the covering 120 with a metal layer by using any proper coating method.

Upon the process step S120 being performed, a first member 139 having a cross-section as illustrated in FIG. 6 is obtained.

<Process Step S130>

Figure 7:
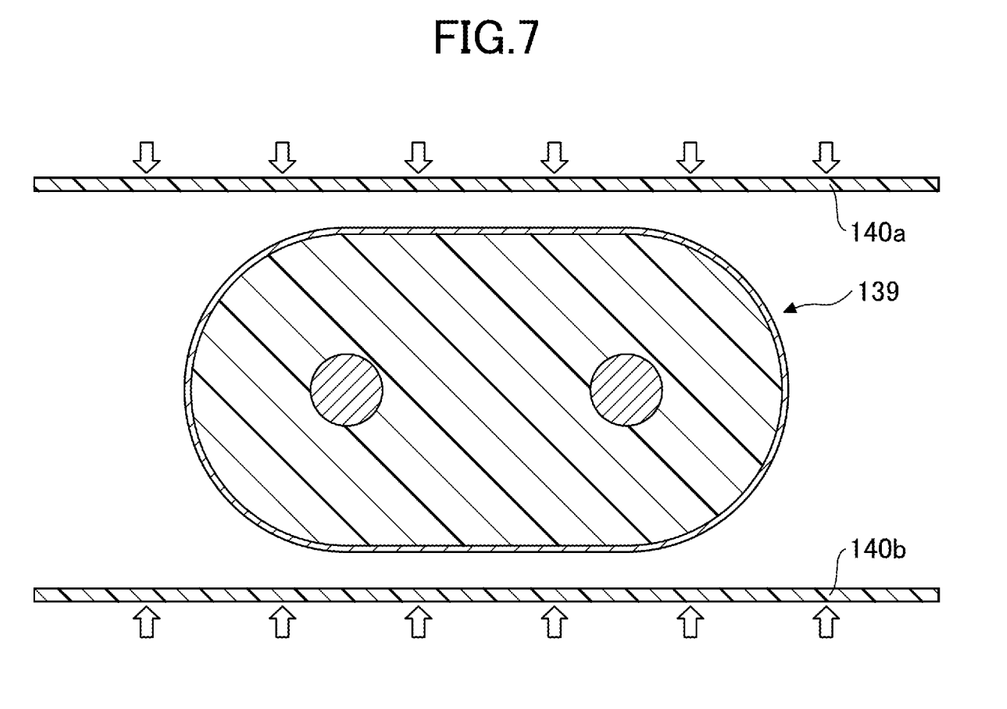
FIG. 7 is a drawing schematically illustrating a process step of making the two-core flat cable according to the embodiment of the present invention.

Resin sheets are then laminated around the first member 139 to form the sheath 160.

For this lamination process, a resin sheet 140a is set above the first member 139, and a resin sheet 140b is set below the first member 139, as illustrated in FIG. 7. The resin sheets 140a and 140b are made of polyethylene terephthalate (PET), polyvinyl chloride, polyethylene, or the like, for example.

In this state, pressure is applied to the resin sheet 140a from the upper side, and pressure is applied to the resin sheet 140b from the lower side, which results in the resin sheet 140a and the resin sheet 140b being deformed and both coming in contact with the outer surface of the first member 139. The ends of the resin sheet 140a also come in contact with the ends of the resin sheet 140b, so that the resin sheet 140a and the resin sheet 140b are bonded to each other.

This results in the formation of the sheath 160 on the outer surface of the shield 130.

As one example, the lamination process may be performed by hot press. For example, pressing members heated to a temperature above room temperature, e.g., 50° C. to 150° C., may be pressed against the resin sheet 140a and the resin sheet 140b from above and below, respectively, to perform the lamination process.

The pressing members used in this process may be made of rubber. Use of the press members made of rubber allows the resin sheet 140a and the resin sheet 140b to be uniformly pressed against the first member 139.

Figure 8:
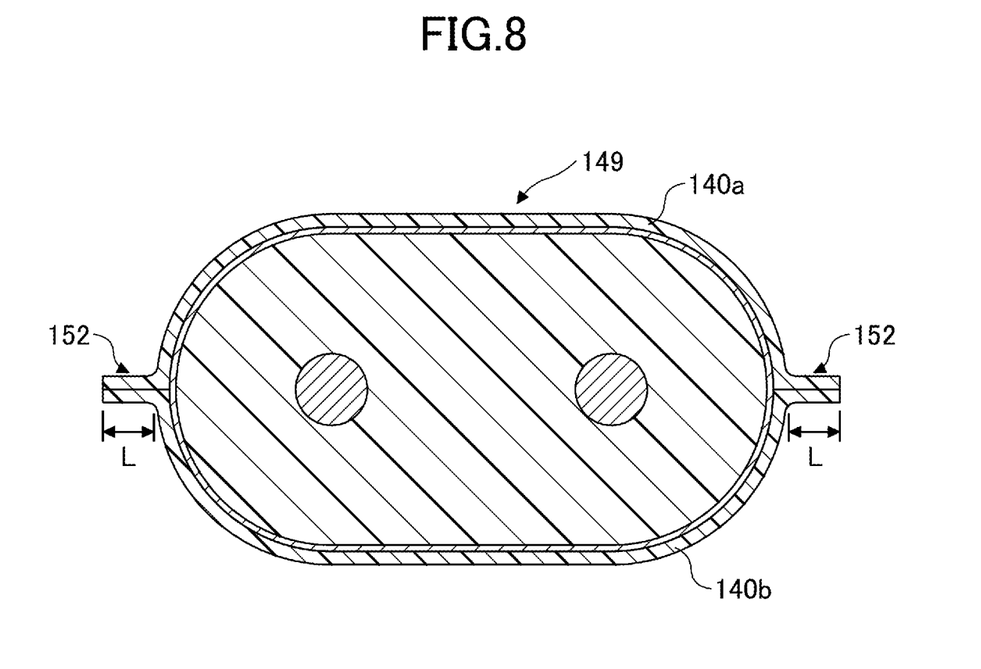
FIG. 8 is a drawing schematically illustrating a process step of making the two-core flat cable according to the embodiment of the present invention.

Upon the lamination process being performed, a second member 149 having a cross-section as illustrated in FIG. 8, for example, is obtained.

As illustrated in FIG. 8, the second member 149 typically has flanges 152 at the connection joints of the resin sheet 140a and the resin sheet 140b. Such flanges 152 may optionally be removed thereafter.

In FIG. 8, the boundary between the resin sheet 140a and the resin sheet 140b is clearly illustrated at the flanges 152 of the second member 149.

It should be noted, however, that this is only an example. There are often cases in which such a boundary is not substantially visible depending on the conditions of the laminating process.

The above-noted process steps enable the manufacture of the first two-core flat cable 100 as illustrated in FIG. 2 and FIG. 3, for example.

<Two-Core Flat Cable of Another Embodiment of Present Invention>

In the following, a two-core flat cable according to another embodiment of the present invention will be described with reference to FIG. 9.

Figure 9:
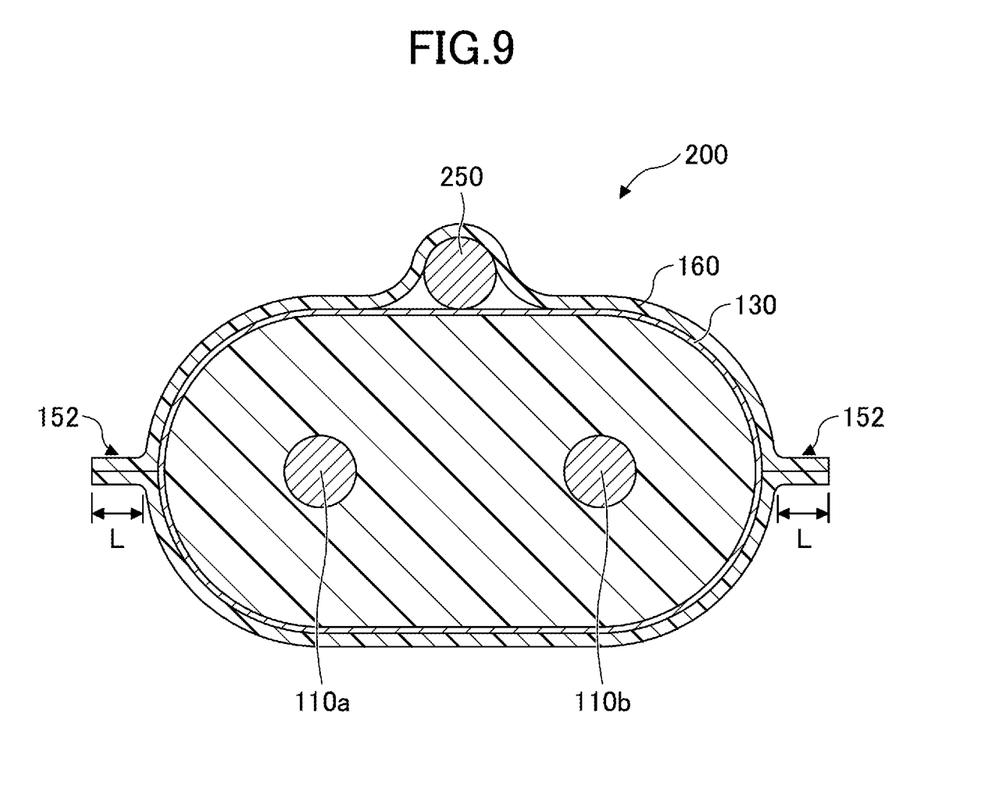
FIG. 9 is a drawing schematically illustrating a cross-section, perpendicular to the longitudinal direction, of a first two-core flat cable according to another embodiment of the present invention.

FIG. 9 illustrates a schematic configuration of a two-core flat cable 200 (hereinafter referred to as a "second two-core flat cable") according to another embodiment of the present invention. FIG. 9 schematically illustrates a cross-section of the second two-core flat cable 200 perpendicular to the axial direction thereof.

As illustrated in FIG. 9, the second two-core flat cable 200 has substantially the same configuration as the first two-core flat cable 100 previously described. Accordingly, in FIG. 9, members similar to those of the first two-core flat cable 100 are referred to by similar reference characters.

The second two-core flat cable 200 differs from the first two-core flat cable 100 previously described in that a drain wire 250 is further provided.

The drain wire 250 includes a metal wire, and may have substantially the same configuration as the metal wires 110a and 110b, for example.

The drain wire 250 is disposed between the shield 130 and the sheath 160 in contact with both.

In the example illustrated in FIG. 9, the drain wire 250 and the two metal wires 110a and 110b are situated at the positions of the vertices of an approximate isosceles triangle in a cross-sectional view of the second two-core flat cable 200. It may be noted, however, that this is only an example. The drain wire 250 may be situated at any location between the shield 130 and the sheath 160.

Those skilled in the art readily understand that the second two-core flat cable 200 having such a configuration also provides the same advantages as the first two-core flat cable 100 previously described.

The second two-core flat cable 200 further provides an additional advantage in that the misalignment of the drain wire 250 is significantly reduced during manufacture.

For example, during the manufacture of a conventional two-core flat cable containing a drain wire, a shield is formed around the resin covering that covers a pair of metal wires. A drain wire is then placed in contact with the shield, followed by winding a sheath tape to bundle and cover the shield and the drain.

However, when the sheath tape is wound around, a force is likely to be applied to the drain wire in the circumferential direction of the shield. This tendency increases as the number of turns increases. Because of this, the configuration of a conventional two-core flat cable gives rise to a problem in that the drain wire is misaligned from its intended position during manufacture.

In contrast, the second two-core flat cable 200 has the sheath 160 that is made by bundling and laminating the shield 130 and the drain wire 250. Accordingly, the possibility that the position of the drain wire 250 is displaced during a subsequent process is significantly reduced.

<Two-Core Flat Cable of Yet Another Embodiment of Present Invention>

In the following, a two-core flat cable according to yet another embodiment of the present invention will be described with reference to FIG. 10.

Figure 10:
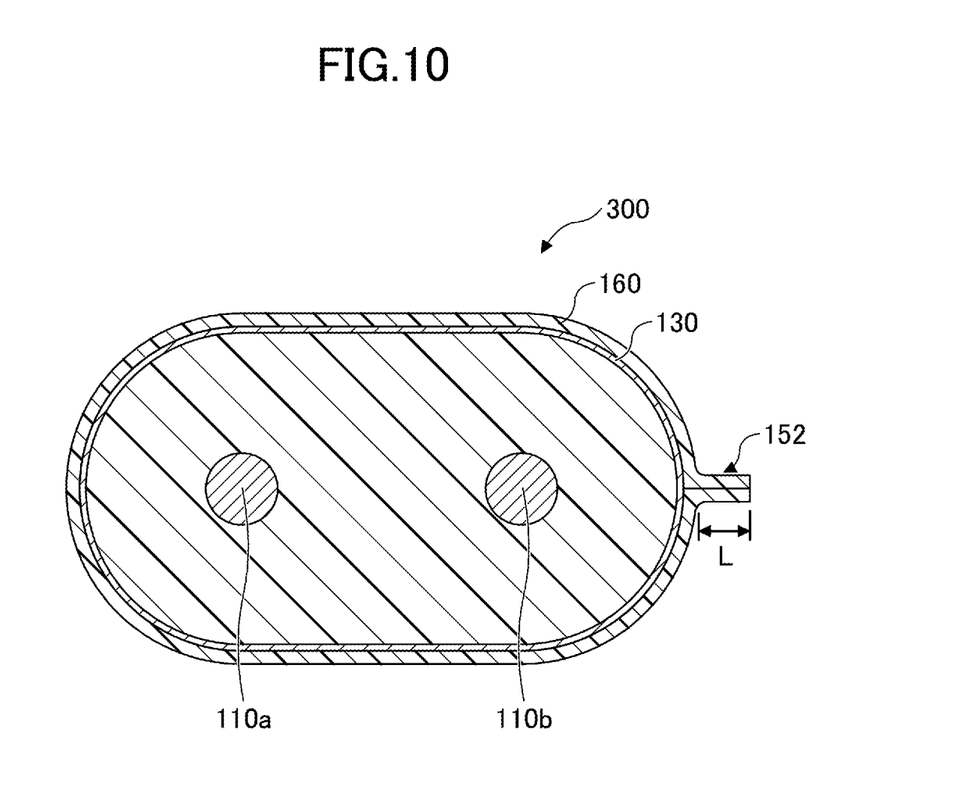
FIG. 10 is a drawing schematically illustrating a cross-section, perpendicular to the longitudinal direction, of a first two-core flat cable according to yet another embodiment of the present invention.

FIG. 10 illustrates a schematic configuration of a two-core flat cable 300 (hereinafter referred to as a "third two-core flat cable") according to yet another embodiment of the present invention. FIG. 10 schematically illustrates a cross-section of the third two-core flat cable 300 perpendicular to the axial direction thereof.

As illustrated in FIG. 10, the third two-core flat cable 300 has substantially the same configuration as the first two-core flat cable 100 previously described. Accordingly, in FIG. 10, members similar to those of the first two-core flat cable 100 are referred to by reference characters similar to those shown in FIG. 3.

The third two-core flat cable 300 differs from the first two-core flat cable 100 previously described in that there is only one flange 152 formed on the outer surface of the sheath 160 in the cross-section of the two-core flat cable perpendicular to the longitudinal direction thereof. The length of the flange 152 is 0.1 mm to 10 mm. The length of the flange 152 is preferably 0.1 mm to 1 mm, and even more preferably 0.1 mm to 0.5 mm.

In the case of the third two-core flat cable 300, one resin sheet is bent and laminated to form the sheath 160. As a result, one flange 152 is formed. Provision of the single flange 152 enables the further stabilization of electrical characteristics.

The embodiment of the present invention has heretofore been described with reference to the first to third two-core flat cables 100, 200, and 300.

However, it would be apparent to those skilled in the art that the present invention is not limited to the configuration of the first to third two-core flat cables 100, 200, and 300.

For example, the first to third two-core flat cables 100, 200, and 300 are such that two metal wires are covered with the covering 120. Notwithstanding this, the number of metal wires covered with the covering 120 may be three or more.

Various further modifications are also possible.

The scope of the present invention is defined by what is described in the claims, and the present invention is intended to include any modifications that are within the intended meaning and scope of what is described in the claims and equivalents thereof.

DESCRIPTION OF REFERENCE SYMBOLS 100 first two-core flat cable
110a, 110b metal wires
120 covering
130 shield
139 first member
140a, 140b resin sheet
149 second member
152 flange
160 sheath
200 second two-core flat cable
250 drain wire
300 third two-core flat cable

The invention claimed is:

1. A two-core flat cable comprising:
a pair of metal wires;
an insulating covering that bundles and covers the pair of metal wires along a longitudinal direction thereof;
an electrically conductive shield that is in direct contact with the covering and covers an entire perimeter surface of the covering; and
an insulating sheath that covers the shield,
wherein the shield is comprised of a metal coating layer,
wherein the sheath is comprised of a lamination sheet of an insulating resin,
wherein the shield and the sheath are each in the absence of a structure made by winding a tape-shaped member, and are each in the absence of a periodic structure,
wherein the shield is a metal deposited around the covering,
wherein a cross-sectional shape of the covering is an elliptical shape, a flattened circular shape, or a shape formed by connecting two parallel lines with arc-shaped curved lines, and
wherein the sheath has one or more flanges on an outer surface thereof at a cross-section of the two-core flat cable perpendicular to a longitudinal direction thereof, and the shield is absent at the one or more flanges.

2. The two-core flat cable as claimed in claim 1, further comprising a drain wire on an outer side of the shield,
wherein the sheath bundles and surrounds the shield and the drain wire.

3. The two-core flat cable as claimed in claim 1, wherein the lamination sheet is made of polyethylene terephthalate (PET), polyvinyl chloride, or polyethylene.

4. The two-core flat cable as claimed in claim 1, wherein a number of the flanges is one.

5. The two-core flat cable as claimed in claim 1, wherein a number of the flanges is two.

6. The two-core flat cable as claimed in claim 1, wherein a length of the flanges is greater than or equal to 0.1 mm and less than or equal to 10 mm.

7. The two-core flat cable as claimed in claim 1, wherein a length of the flanges is greater than or equal to 0.1 mm and less than or equal to 1 mm.

8. The two-core flat cable as claimed in claim 1, wherein a length of the flanges is greater than or equal to 0.1 mm and less than or equal to 0.5 mm.

\* \* \* \* \*